United States Patent
Seo

(12) 
(10) Patent No.: US 6,741,136 B2
(45) Date of Patent: May 25, 2004

(54) CIRCUIT FOR PREVENTING SYSTEM MALFUNCTION IN SEMICONDUCTOR MEMORY AND METHOD THEREOF

(75) Inventor: Jun Ho Seo, Choongcheongbuk-Do (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 10/152,624

(22) Filed: May 23, 2002

(65) Prior Publication Data

US 2002/0175773 A1 Nov. 28, 2002

(30) Foreign Application Priority Data

May 25, 2001 (KR) ........................................ 2001-29029

(51) Int. Cl.[7] ................................................ H03B 1/00
(52) U.S. Cl. ........................................... 331/74; 331/15

(58) Field of Search ............................... 331/15, 74, 44, 331/40, 109; 327/58, 72, 77, 142, 291, 292, 306, 331

(56) References Cited

U.S. PATENT DOCUMENTS 5,187,453 A      2/1993  Aoyagi et al. ......... 331/116 FE
5,794,022 A   *  8/1998  Karouji .................... 713/601

* cited by examiner

*Primary Examiner*—Timothy P. Callahan
*Assistant Examiner*—Cassandra Cox
(74) *Attorney, Agent, or Firm*—Birch, Stewart, Kolasch & Birch, LLP

(57) ABSTRACT

A circuit for preventing a system malfunction in a semiconductor memory includes an oscillating circuit generating an oscillating clock signal by receiving an oscillating signal, a system clock generator generating a system clock signal by receiving the oscillating clock signal, and a malfunction preventing unit resetting an inner system by sensing an amplitude variation of the oscillating signal wherein the amplitude variation is caused by noise.

15 Claims, 4 Drawing Sheets a system clock signal according to the related art comprises a resonator 100 generating an oscillating signal, an oscillator circuit 200 generating an oscillating clock signal CLK by receiving the oscillating signal, a noise filter 300 filtering a radio frequency component of the oscillating clock signal CLK, and a system clock generator 400 generating a plurality of system clock signals SCLK0, SCLK1 . . . using the filtered oscillating clock signal CLK. In this case, the resonator 100 is constructed with oscillating capacitors C1 and C2 and a crystal resonator Xtal.

CIRCUIT FOR PREVENTING SYSTEM MALFUNCTION IN SEMICONDUCTOR MEMORY AND METHOD THEREOF

BACKGROUND OF THE INVENTION

1. Field of the Invention

The present invention relates to a semiconductor memory, and more particularly, to a circuit for preventing a system malfunction in a semiconductor memory and method thereof.

2. Discussion of the Related Art

FIG. 1 illustrates a system clock generation circuit according to the related art.

Referring to FIG. 1, a circuit for generating a system clock signal according to the related art comprises a resonator 100 generating an oscillating signal, an oscillator circuit 200 generating an oscillating clock signal CLK by receiving the oscillating signal, a noise filter 300 filtering a radio frequency component of the oscillating clock signal CLK, and a system clock generator 400 generating a plurality of system clock signals SCLK0, SCLK1 . . . using the filtered oscillating clock signal CLK. In this case, the resonator 100 is constructed with oscillating capacitors C1 and C2 and a crystal resonator Xtal.

The oscillating circuit 200 includes a transfer gate TG1 and an inverter IN1 connected between pins Xin and Xout in parallel, an NMOS transistor NM1 connected between an input terminal of the inverter IN1 and a ground to pull down the pin Xin, and a NOR gate NOR1 generating the oscillating clock signal CLK NORing a stop signal and NOR gate NOR1 generating the oscillating clock signal CLK NORing a stop signal and the oscillating signal. In this case, operation of the transfer gate TG1 is controlled by the stop signal.

Operation of the circuit for generating a system clock signal according to related art is explained by referring to the attached drawing as follows.

When the resonator 100, i.e. the oscillating capacitors C1 and C2 and crystal resonator Xtal, is connected between the pins Xin and Xout, the oscillating signal having a sine wave as shown in FIG. 2(A) is applied to the pin Xout. In this case, Vmin is approximately equal to 0 and Vmax is approximately equal to Vcc.

First of all, when a stop signal of high level is inputted, the oscillating circuit 200 is initialized.

When a stop signal of high level is inputted, the transfer gate TG1 is turned off and the NMOS transistor NM1 is turned on. Thus, the oscillating circuit 200 stops operating. In this case, pull-down operation of the turned-on NMOS transistor NM1 enables the pin Xin to maintain ground level, while the other pin Xout connected to the pin Xin through the inverter IN1 maintains a level equal to 'Vcc'.

With the above state, when a stop signal of low level is inputted, the oscillating circuit 200 carries out normal oscillating operation.

When the stop signal of high level is inputted, the transfer gate TG1 is turned on and the NMOS transistor NM1 is turned off. Thus, the oscillating signal outputted from the resonator 100 is inputted to one terminal of the NOR gate NOR1 through the pin Xout. The NOR gate NOR1 carries out NORing on the oscillating signal inputted to one terminal and the stop signal inputted to the other terminal and then outputs the oscillating clock signal CLK as shown in FIG. 2(B). In this case, a logic-threshold value of the NOR gate NOR1 is equal to ½ Vcc.

Therefore, the noise filter 300 removes the radio frequency component from the oscillating clock signal CLK generated from the oscillating circuit 200 and then outputs the filtered oscillating clock signal CLK to the system clock generator 400. The system clock generator 400 then generates a plurality of the system clock signals SCLK0 SCLK1 . . . using the filtered oscillating clock signal CLK.

Meanwhile, noise at the oscillating stage means that abnormality of frequency or amplitude of the oscillating signal occurs since a signal other than a normal oscillating signal is applied to the pin Xin or Xout. Besides, a radio frequency component of the oscillating signal is removed by the noise filter 300. Yet, a signal which is not the radio frequency signal, as shown in FIG. 2(A), results in increasing a minimum amplitude of the oscillating signal or decreasing a maximum amplitude of the oscillating signal. Specifically, such a variation of the amplitude is difficult to detect and cannot be removed by a certain circuit.

Therefore, when noise is applied to the pins Xin and Xout, the waveform of the oscillating signal is distorted as shown in FIG. 2. Thus, minimum and maximum amplitudes of the oscillating signal are changed. Such variations of the waveform cause alterations in the pulse width of the oscillating clock signal CLK. Consequently, such a pulse width variation also changes a duty of the system clock signal SCLK, thereby bringing about malfunctions in a system using the system clock signal SCLK inside an IC such as a CPU.

SUMMARY OF THE INVENTION

Accordingly, the present invention is directed to a circuit for preventing system malfunction in a semiconductor memory and method thereof that substantially obviates one or more problems due to limitations and disadvantages of the related art.

An object of the present invention is to provide a circuit for preventing system malfunction in a semiconductor memory and method thereof enabling prevention of system malfunction due to noise resulting from an oscillating stage.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a circuit for preventing system malfunction in a semiconductor memory according to the present invention includes an oscillating circuit generating an oscillating clock signal by receiving an oscillating signal, a system clock generator generating a system clock signal by receiving the oscillating clock signal, and a malfunction preventing unit resetting an inner system by sensing an amplitude variation of the oscillating signal wherein the amplitude variation is caused by noise.

In another aspect of the present invention, a method of preventing system malfunction in a semiconductor memory includes the steps of generating an oscillating clock signal by receiving an oscillating signal, generating a system clock signal using the oscillating clock signal, sensing an amplitude variation of the oscillating signal wherein the amplitude variation is caused by noise, and resetting an inner system when an amplitude of the oscillating signal is out of a predetermined range.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
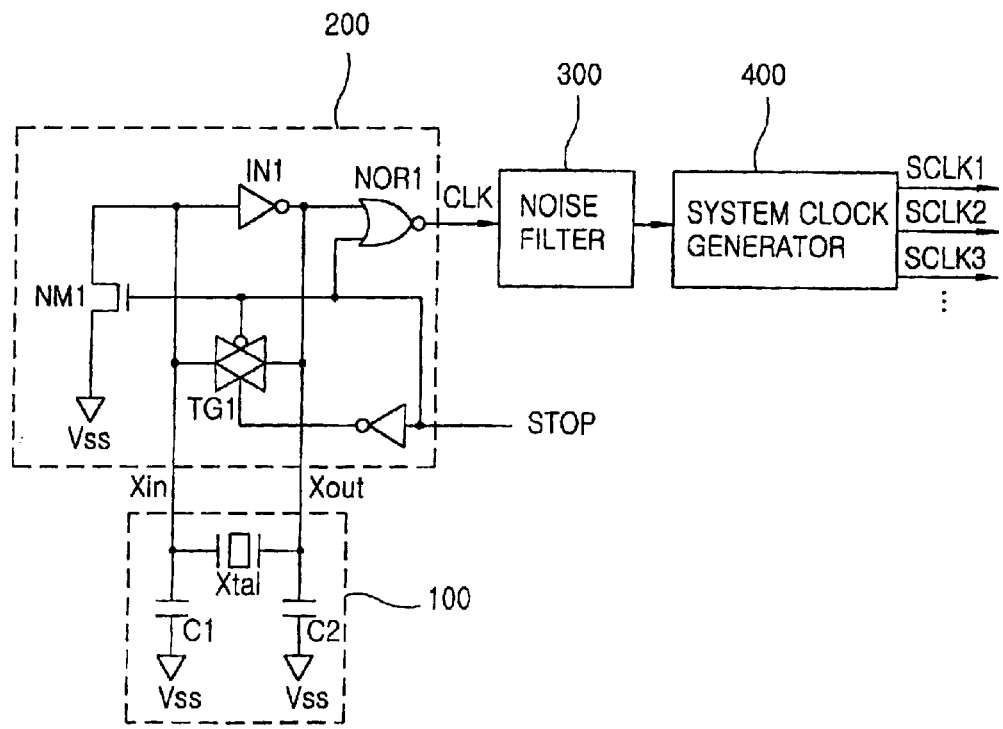
FIG. 1 illustrates a system clock generation circuit according to the related art.
Figure 2:
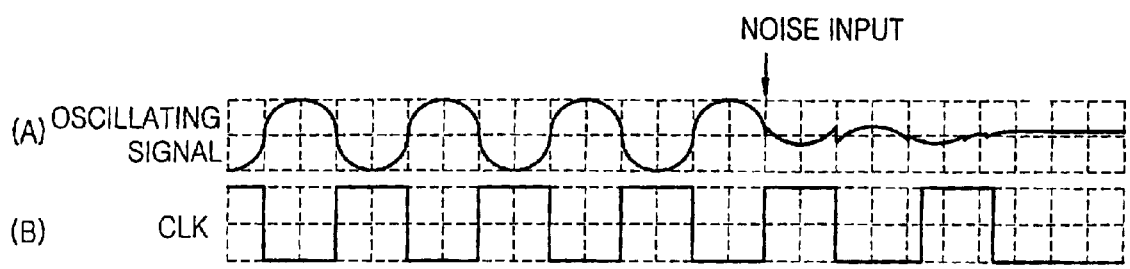
FIG. 2 illustrates waveforms of oscillating signal and oscillating clock signal in FIG. 1.
Figure 3:
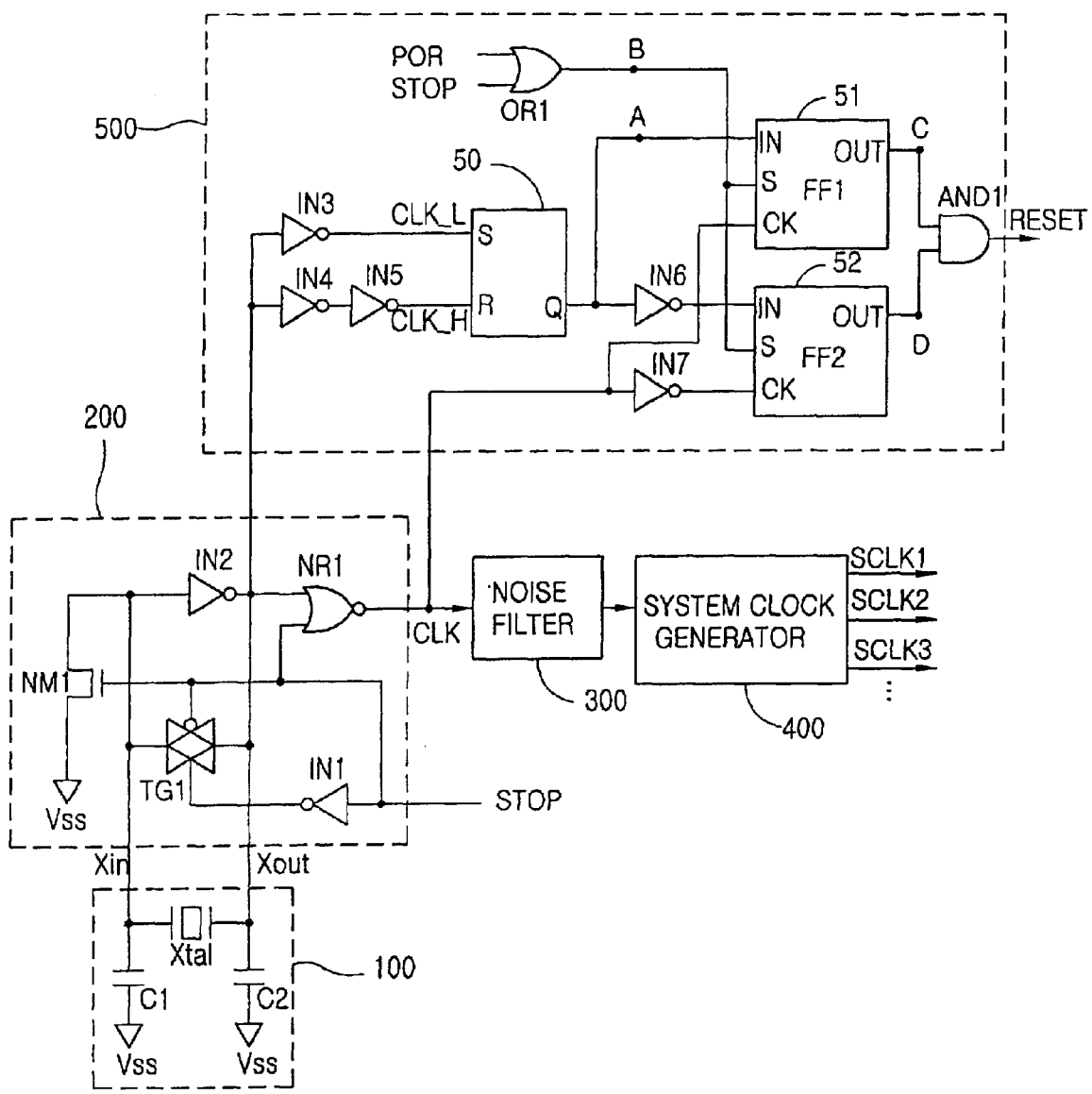
FIG. 3 illustrates a circuit for preventing a system malfunction in a semiconductor memory according to the present invention.

FIG. 3 illustrates a circuit for preventing system malfunction in a semiconductor memory according to the present invention.

Referring to FIG. 3, a circuit for preventing system malfunction in a semiconductor memory according to the present invention includes a resonator 100, an oscillating circuit 200, a noise filter 300, a clock signal generator 400, and a malfunction preventing unit 500.

The constructions of the resonator 100, oscillating circuit 200, noise filter 300, and clock signal generator 400 are equivalent to those of the related art.

The malfunction preventing unit 500 includes an OR gate OR1 ORing a power-on reset signal POR and a stop signal, an inverter IN3 sensing a minimum amplitude variation of an oscillating signal, an inverter IN4 sensing a maximum amplitude variation of the oscillating signal, an inverter IN5 inverting an output of the inverter IN4, an SR latch 50 latching outputs of the inverters IN3 and IN5, first and second flip-flops 51 and 52 latching an output of the SR latch 50 at descending and ascending edges of an oscillating clock signal CLK, respectively, and an AND gate AND1 generating a system reset signal RESET by ending output signals of the first and second flip-flops. In this case, the inverter IN3 has a first logic-threshold value (⅓ Vcc) lower than ½ Vcc, and the inverter IN4 has a second logic-threshold value (⅔ Vcc) higher than ½ Vcc.

Figure 4:
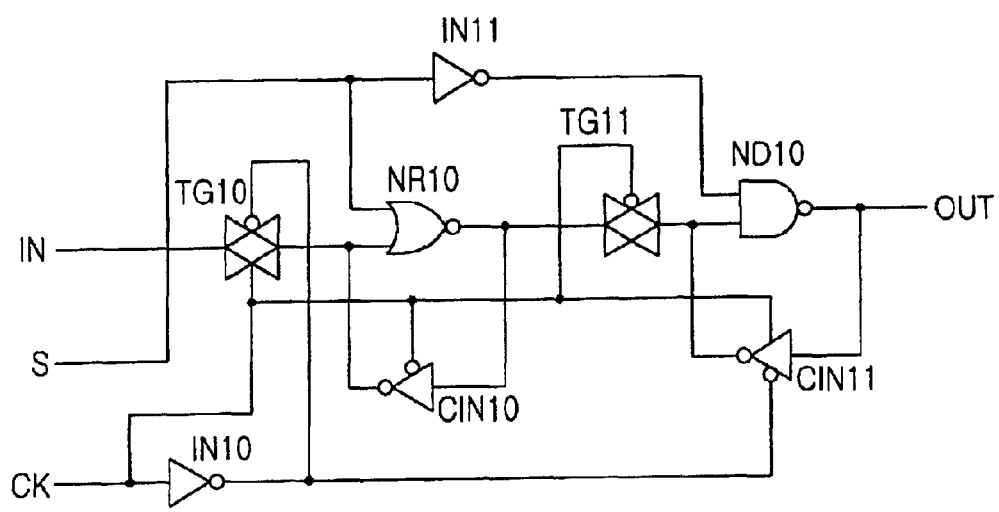
FIG. 4 illustrates detailed constructions of first and second flip-flop circuits in FIG. 3.

The first and second flip-flops 51 and 52, as shown in FIG. 4, are connected in series between an input terminal IN and an output terminal OUT. The first and second flip-flops 51 and 52 include transfer gates TG10 and TG11 being turned on by the oscillating clock signals CLK having different levels, and first and second latches NR10/CIN10 and ND10/CIN11, respectively.

Operation of the above-constructed circuit for preventing system malfunction in a semiconductor memory according to the present invention is explained by referring to the attached drawings as follows.

(1) Initializing Section

Figure 5:
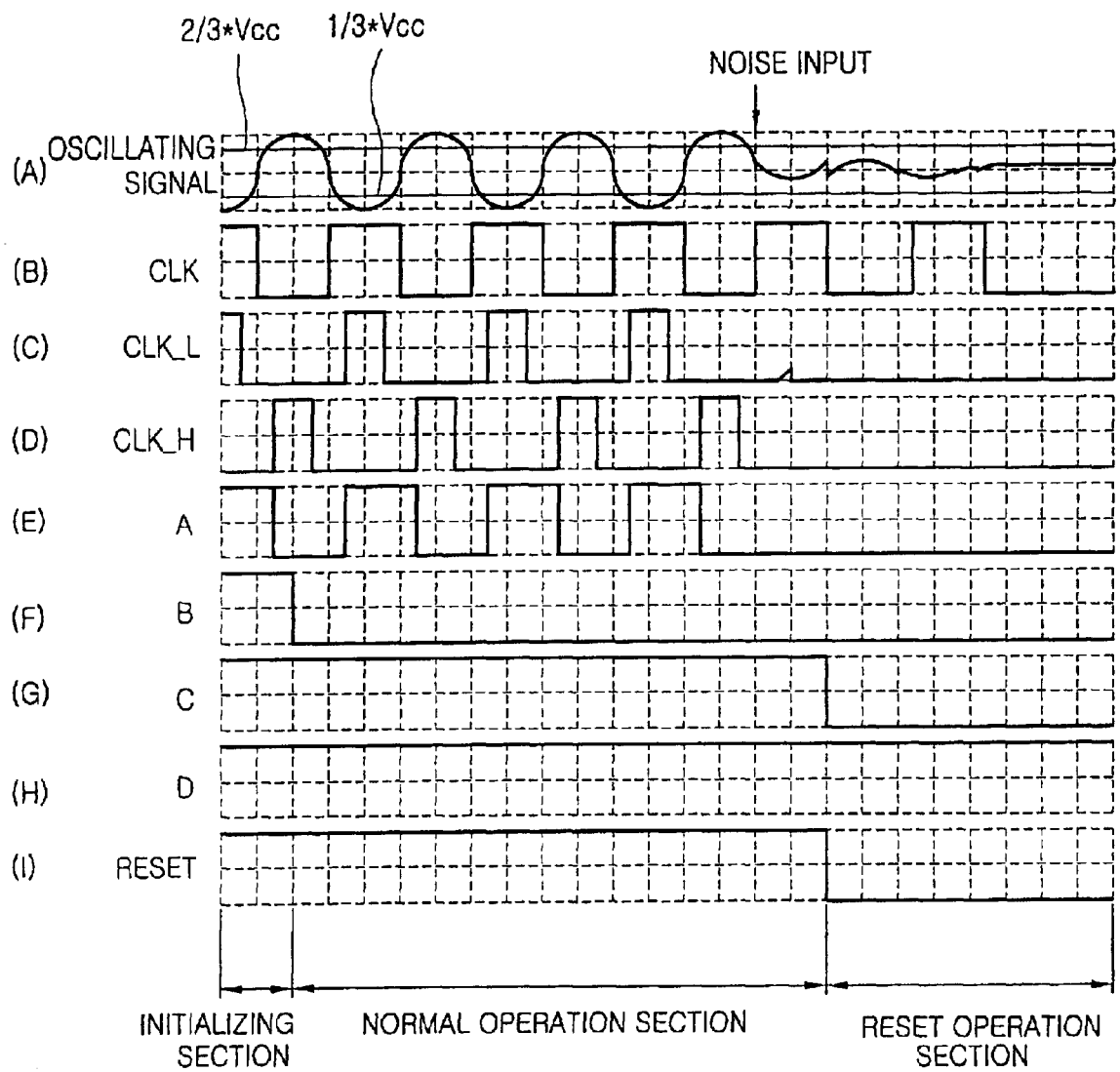
FIG. 5 illustrates input/output waveforms of the respective units in FIG. 3.

An initializing section in FIG. 5 is an interval in which the oscillating circuit 200 and malfunction preventing unit 500 are initialized by the stop signal. During the initializing section, outputs of the oscillating circuit 200 and malfunction preventing unit 500 are fixed to high level. Moreover, the malfunction preventing unit 500 is initialized by the power-on reset signal POR of high level inputted when power-on is activated.

(2) Normal Operation Section

A normal operation section is an interval from which system clock signals SCLK0, SCLK1 . . . are generated normally through the oscillating circuit 200, noise filter 300, and clock generator 400. Detailed operation of the normal operation section is the same as the related art.

In this case, the malfunction preventing circuit 500, as shown in FIG. 5(I), outputs the reset signal RESET of high level and maintains a previous state. Namely, the inverter IN3 has the first logic-threshold value ⅓ Vcc and the inverter IN4 has the second logic-threshold value ⅔ Vcc. Thus, when the oscillating signal passes through the inverters IN3 to IN5, amplitude sense signals CLK_L and CLK_H having the same forms shown in FIG. 5(C) and FIG. 5(D) are outputted from the inverters IN3 and IN5. The SR latch 50 is set at the ascending edge of the amplitude sense signal CLK_L and becomes reset at the ascending edge of the other amplitude sense signal CLK_H, thereby generating a clock signal A having the same form shown in FIG. 5(E).

The first flip-flop 51 latches the clock signal A at the descending edge of the oscillating clock signal CLK outputted from the oscillating circuit 200 to output a signal C of high level as shown in FIG. 4(G). The second flip-flop 52 latches the oscillating clock signal CLK, which has been inverted by the inverter IN6, at the ascending edge of the oscillating clock signal CLK so as to output a signal D of high level as shown in FIG. 5(H).

Namely, as shown in FIG. 4, the transfer gate TG10 of the first flip-flop 51 is turned on by the oscillating clock signal CLK of high level. And, the output signal A, which is applied to the input terminal IN, of the SR latch 50 is transferred to the NOR gate NR10 through the turned-on transfer gate TG10. In this case, the NOR gate NR1, which is operated as an inverter by the signal B inputted to a set terminal S, plays a role of a latch with the clock inverter CIN10.

Thereafter, when the oscillating clock signal CLK is shifted to low level, the transfer gate TG10 is turned off and the other transfer gate TG11 is turned on. Then, the output signal A having been latched by the NOR gate NR10 and clock inverter CIN10 is inputted to the NAND gate ND10 through the transfer gate TG11. Therefore, the NAND gate ND10 is operated as an inverter by the output signal of the inverter IN11 to latch the output signal of the transfer gate TG11 with the clock inverter CIN11, thereby outputting the signal C of high level as shown in FIG. 5(G). Operation of the second flip-flop 52 is carried out in the same manner of the first flip-flop 51, of which detailed explanation is skipped.

Therefore, the AND gate AND1 ends the signals C and D of high level outputted from the first and second flip-flops 51 and 52 so as to output the system reset signal of high level shown in FIG. 5(I) to an inner system.

(3) Reset Operation Section

A reset operation section is an interval for which a waveform of the oscillating signal is distorted, as shown in FIG. 5, since noise is applied to the pins Xin and Xout. For this section, the waveform distortion of the oscillating signal changes the duty of the system clock signal SCLK, which may cause the malfunction on the inner system using the system clock signal SCLK.

Therefore, the malfunction preventing unit 500 senses an amplitude variation of the oscillating signal for the reset operation section. If the amplitude of the oscillating signal becomes out of range, the malfunction preventing unit 500 resets the inner system so as to prevent the malfunction, which is caused by the noise of an oscillating stage, of the system.

Operation of the malfunction preventing unit 500 is explained in detail as follows:

When the noise is applied to both of the pins Xin and Xout of the oscillating circuit 200, as shown in FIG. 5(A), a minimum value of the oscillating signal increases from an input time point of the noise and a maximum value of the oscillating signal starts to decrease. While maintaining this state, if the minimum value of the oscillating signal increases to a value greater than the first logic-threshold value ⅓ Vcc, the inverter IN3, as shown in FIG. 5(c), outputs the amplitude sense signal CLK_L of low level. If the maximum value of the oscillating signal is decreased to a value less than the second logic-threshold value ⅔ Vcc, the inverter IN5, as shown in FIG. 5(D), outputs the amplitude sense signal CLK_H of low level.

The SR latch 50 outputs the clock signal A of low level, as shown in FIG. 5(E), in accordance with the amplitude sense signals CLK_L and CLK_H of low level.

The first flip-flop 51 samples the clock signal A of low level at the descending edge of the oscillating clock signal CLK so as to output the signal C of low level shown in FIG. 4(G). And, the second flip-flop 52 samples the oscillating clock signal CLK having been inverted by the inverter IN6 at the ascending edge of the oscillating clock signal CLK, thereby outputting the signal D of high level shown in FIG. 5(H).

Therefore, the AND gate AND1 ends the output signals C and D of the first and second flip-flops 51 and 52 and outputs the system reset signal RESET of low level shown in FIG. 5(I) to the inner system so as to reset the inner system. Thus, the malfunction of the system due to the noise of the oscillating stage is prevented.

For the convenience of explanation, the sense range of the oscillating signal is set up between the first and second logic-threshold values in the above description of the present invention. The present invention is not limited to the above sense range. Further, the present invention enables to sense the amplitude variation of the oscillating signal by setting up the first or second logic-threshold value.

Accordingly, the present invention enables to prevent the malfunction of a system due to noise of an oscillating stage by resetting an inner system by sensing an amplitude variation of an oscillating signal due to an oscillating noise.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A circuit for preventing a system malfunction in a semiconductor memory, comprising:
   an oscillating circuit that generates an oscillating clock signal by receiving an oscillating signal;
   a system clock generator that generates a system clock signal by receiving the oscillating clock signal; and
   a malfunction preventing unit that senses an amplitude variation of the oscillating signal and resets an inner system if a minimum amplitude of the oscillating signal increases above the first logic-threshold value and if a maximum amplitude of the oscillating signal decreases below the second logic-threshold value.

2. The circuit of claim 1, the malfunction preventing unit comprising:
   an OR gate ORing a power-on signal and a stop signal;
   a first inverter having a first logic-threshold value;
   a second inverter having a second logic-threshold value;
   a third inverter inverting an output of the second inverter;
   an SR latch latching outputs of the first and third inverters;
   first and second flip-flops latching an output of the SR latch at descending and ascending edges of the oscillating clock signal, respectively; and
   an AND gate outputting a system reset signal by anding outputs of the first and second flip-flops.

3. The circuit of claim 1, wherein the first logic-threshold value is set up to be lower than ½ Vcc and the second logic-threshold value is set up to be higher than ½ Vcc.

4. The circuit of claim 2, wherein the first inverter outputs an amplitude sense signal of low level if a minimum value of the oscillating signal is increased over the first logic-threshold value and wherein the second inverter outputs the amplitude sense signal of low level if a maximum value of the oscillating signal is decreased below the second logic-threshold value.

5. The circuit of claim 2, the first and second flip-flops comprising:
   first and second transfer gates connected in series between input and output terminals so as to transfer the output of the SR latch in accordance with the oscillating clock signal; and
   first and second latches connected to output terminals of the first and second transfer gates, respectively.

6. The circuit of claim 5, wherein the first transfer gate is turned on at the ascending edge of the oscillating clock signal and wherein the second transfer gate is turned on at the descending edge of the oscillating clock signal.

7. A circuit for preventing a system malfunction in a semiconductor memory, comprising:
   an oscillating circuit generating an oscillating clock signal by receiving an oscillating signal;
   a system clock generator generating a plurality of system clock signals by receiving the oscillating clock signal; and
   a malfunction preventing unit resetting an inner system by sensing an amplitude variation of the oscillating signal wherein the amplitude variation is caused by a noise, and
   wherein the malfunction preventing unit comprises an OR gate ORing a power-on signal and a stop signal, a first inverter having a first logic-threshold value, a second inverter having a second logic-threshold value, a third inverter inverting an output of the second inverter, an SR latch latching outputs of the first and third inverters, first and second flip-flops latching an output of the SR latch at descending and ascending edges of the oscillating clock signal, respectively, and an AND gate outputting a system reset signal by anding outputs of the first and second flip-flops.

8. The circuit of claim 7, wherein the first inverter outputs an amplitude sense signal of low level if a minimum value of the oscillating signal is increased over above the first logic-threshold value and wherein the second inverter outputs the amplitude sense signal of low level if a maximum value of the oscillating signal is decreased below the second logic-threshold value.

9. The circuit of claim 8, wherein the first logic-threshold value is set up to be lower than ½ Vcc and the second logic-threshold value is set up to be higher than ½ Vcc.

10. The circuit of claim 7, the first and second flip-flops comprising:

first and second transfer gates connected in series between input and output terminals so as to transfer the output of the SR latch in accordance with the oscillating clock signal; and first and second latches connected to output terminals of the first and second transfer gates, respectively.

11. The circuit of claim 10, wherein the first transfer gate is turned on at the ascending edge of the oscillating clock signal and wherein the second transfer gate is turned on at the descending edge of the oscillating clock signal.

12. A method of preventing a system malfunction in a semiconductor memory, comprising:

generating an oscillating clock signal by receiving an oscillating signal;

generating a system clock signal using the oscillating clock signal;

sensing an amplitude variation of the oscillating signal wherein the amplitude variation is caused by a noise; and resetting an inner system if a minimum amplitude of the oscillating signal increases above the first logic-threshold value and if a maximum amplitude of the oscillating signal decreases below the second logic-threshold value.

13. The circuit of claim 12, wherein the first logic-threshold value is set up to be lower than ½ Vcc and the second logic-threshold value is setup to be higher than ½ Vcc.

14. The circuit of claim 12, wherein the inner system is reset if a minimum amplitude of the oscillating signal increases above the first logic-threshold value or a maximum amplitude of the oscillating signal decreases below the second logic-threshold value.

15. The circuit of claim 14, wherein the first logic-threshold value is setup to be lower than ½ Vcc and the second logic-threshold value is set up to be higher than ½ Vcc.

* * * * *